Oct. 28, 1958 A. P. STERN ET AL 2,858,424

TRANSISTOR AMPLIFIER WITH AUTOMATIC COLLECTOR BIAS MEANS RESPONSIVE TO SIGNAL LEVEL FOR GAIN CONTROL

Filed Oct. 1, 1954 2 Sheets-Sheet 1

INVENTORS:
ARTHUR P. STERN,
JOHN A. RAPER,
BY George V. Eltgroth
THEIR ATTORNEY.

INVENTORS:
ARTHUR P. STERN,
JOHN A. RAPER,
BY George V. Eltgroth
THEIR ATTORNEY.

United States Patent Office 2,858,424

Patented Oct. 28, 1958

2,858,424

TRANSISTOR AMPLIFIER WITH AUTOMATIC COLLECTOR BIAS MEANS RESPONSIVE TO SIGNAL LEVEL FOR GAIN CONTROL

Arthur P. Stern and John A. Raper, Syracuse, N. Y., assignors to General Electric Company, a corporation of New York Application October 1, 1954, Serial No. 459,629

4 Claims. (Cl. 250—20)

The present invention relates to amplification systems, and in particular to amplification systems employing semi-conductor devices, such as transistors, in which it is desired to derive an amplified output signal whose amplitude is substantially independent of fluctuations in amplitude of the applied signal.

The present invention applies certain of the broad principles disclosed in application Serial Number 400,855 filed December 29, 1953, in the name of Arthur P. Stern. In the above-named application, control of the amplification of a transistor amplifier is achieved through control of the collector operating voltage indirectly by the application of the control voltage to the base electrode of the amplifying transistor. In the preferred embodiments of the present invention, a direct connection to the collector electrode is employed, this mode of connection possessing certain advantages additional to those possessed by the above mentioned arrangement.

Accordingly, it is an object of the present invention to provide an improved amplification system wherein the amplitude of the amplified output is substantially independent of the amplitude of the applied signal.

It is another object of the present invention to provide an amplification system of stabilized output amplitude in which the amplitude stabilizing properties of the circuit are substantially independent of fluctuations in supply voltage.

These and other objects are achieved in a novel amplifying system employing semi-conductor devices of the type having at least three electrodes. In accordance with the invention, the amplification system employs a first transistor in an amplification stage which is of a type complementary to a subsequent transistor which is used to derive a control voltage.

The term complementary is here used to designate the relation between the transistor which is subject to control, and the transistor which develops the control voltage. The first transistor may be of an "NPN" type or a "PNP" type, as they are currently designated, while the transistor which derives the control voltage is of the converse or complementary type, such as a "PNP" or "NPN" type respectively.

The control voltage derived in the above manner is used to vary the collector voltage of the controlled transistor for adjustment of its amplification. In preferred arrangements, the control voltage is directly applied to the collector.

Further advantages in a receiver of amplitude modulated signals are achieved by using the transistor which derives the control voltage as a demodulator. In a frequency modulation receiver, the control voltage deriving transistor may serve as a limiter.

The features of the invention which are believed to be novel are set forth with particularity in the appended claims. The invention itself, however, both as to its organization and method of operation, together with further objects and advantages thereof may best be understood by reference to the following description when taken in connection with the following drawings, wherein:

The present invention employs the principle of amplification control of a transistor amplifier by control of the transistor collector voltage. This principle may be briefly explained by reference to Fig. 1.

Figure 1:
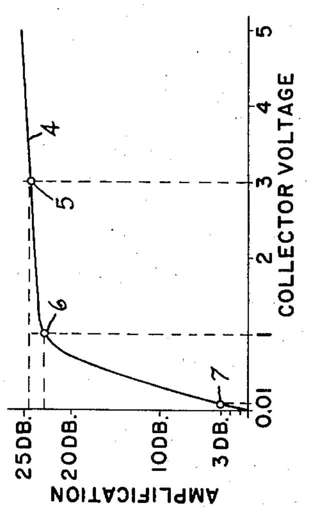
Fig. 1 is a graph illustrative of the principle here applied in controlling the amplification of a transistor amplifier and shows the variation in amplification effected by adjustment of the collector voltage.

Fig. 1 is a graph wherein the amplification of a transistor amplifier is plotted as the ordinate against the collector voltage as the abscissa. The plotted line 4 indicates the relation obtaining in a typical circuit wherein the amplification stage is capable of achieving a maximum gain of 25 decibels with optimum collector voltage. It may be noted that the plot 4 has the greatest slope in the vicinity of zero collector voltage and that the slope is least in regions of high collector voltage. Experience indicates that the curve is essentially of an exponential nature. For optimum amplification, a collector voltage of perhaps 4 or 5 volts would be employed in the amplifier whose characteristics are illustrated. In such an amplifier, reduction of the collector voltage from the optimum value of 4 or 5 volts to 3 volts, corresponding to point 5, would effect no more than one decibel diminution in the amplification. In order, however, to make the amplification stage somewhat more sensitive to control by adjustment of the collector voltage, it is usually preferable to shift the operating collector voltage to a lower value, where the curve is steeper. A suitable operating point is indicated at the point 6 on the graph, a point corresponding to a two decibel attenuation from the optimum amplification and to 1.0 volt of collector voltage. When the operating collector voltage is adjusted to 1.0 volt, a reduction in the collector voltage by 0.99 volt by the amplitude control circuit brings about a reduction of approximately 20 decibels in amplification, to point 7 on the graph. Selection of the operating point at 1.0 collector volt and using a 0.99 volt range of collector voltage control to achieve a 20 decibel reduction in amplification corresponds to the normal mode of operation and usual effectiveness of the control circuit illustrated in Fig. 2.

In a multiple stage amplification system, the controlled amplifier stages are preferably near the input of the system where the applied signal is still at a low level. As the prior discussion indicates, transistors of the controlled amplifier stages are operated at a reduced collector potential. Operation of a transistor at a low collector potential makes it more subject to collector clipping, a condition which exists when one half of the peak to peak potential of the signal appearing at the collector tends to exceed the direct collector potential, and so substantially extinguishes current flow in the collector during such periods. The higher amplitude signals are also subject to substantial distortion due to the non-linearity of the amplification characteristic of the transistor, this latter effect being somewhat more pronounced when low collector potentials are applied. These considerations generally dictate that the first amplifier stages be controlled.

Figure 2:
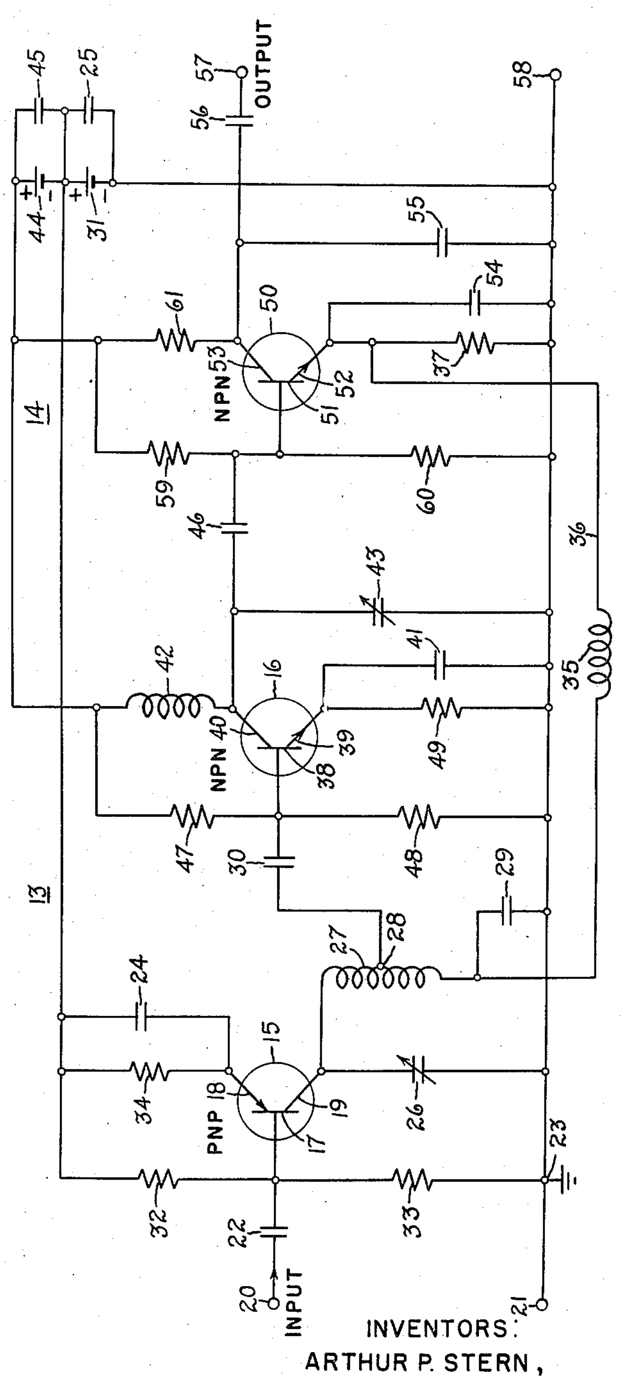
Fig. 2 is a first embodiment of the present invention adapted to serve as the amplifier and demodulator of an amplitude modulated signal.

Referring now to Fig. 2, an exemplary embodiment of the present invention is shown in which the novel amplification system herein disclosed serves as the intermediate frequency amplifier of a superheterodyne type radio receiver of amplitude modulated signals. The control voltages which provide amplification control, are derived in the portion of the receiver which also detects the modulated signal. It should be noted that the circuitry illustrated, with minor changes, may also be used as the preliminary radio frequency stages of a tuned radio frequency receiver or of a superheterodyne receiver. The invention itself, however, should not be considered as limited to the particular circuit disclosed, or to the uses enumerated, since it is in fact an amplifier of general application, and may be advantageously applied in the amplification of frequency and phase modulated signals as will be subsequently shown, and in environments where detection of the signal is not desired other than for the purpose of securing an amplification control voltage. For simplicity, the discussion of Fig. 2 will treat the illustrated circuitry in the performance of the functions of an intermediate frequency amplifier and second detector in a superheterodyne receiver of amplitude modulated signals.

Fig. 2 shows a two stage transistor amplifier 13 followed by a signal detection and control voltage production stage 14. The transistor amplifier 13 employs two transistors 15 and 16 which may be types which are currently designated "PNP" and "NPN," respectively. Either a PNP or an NPN type of transistor may be employed in the second stage of the amplifier 13 and the design of its associated amplification stage may be conventional. The choice of transistor 15 and design of its associated circuitry is a part of the present invention, and will be discussed in detail subsequently. Transistor 15 is shown having three electrodes including a base 17, an emitter 18, and a collector 19.

The transistor 15 is connected to operate in a grounded emitter configuration. A source of amplitude modulated signals, not shown, is coupled to input terminals 20 and 21 of the amplification system. The base 17 of transistor 15 is coupled through a coupling capacitor 22 to input terminal 20. Terminal 21 is coupled to ground at 23. A capacitor 24 is coupled between the emitter 18 and a capacitor 25, whose other terminal is coupled to ground. These capacitors form the grounding path with respect to signal voltages for the emitter 18.

Output of the transistor 15 is derived in the following manner. The collector 19 is coupled to the joined terminals of a capacitance 26 and an inductance 27 which form a parallel resonant load circuit. The signal ground return path for the inductance 27 is established through a capacitance 29 coupled between the end of the inductance remote from the collector 19 and ground. The resonating capacitance 26 has its terminal remote from the collector 19 grounded directly. An output tap 28 is provided on inductance 27 for output connection. The position of the output tap 28 is selected to match the output impedance of transistor 15 to the input impedance of transistor 16 in order to maximize power transfer to the succeeding stage. The tap 28 is connected to coupling capacitor 30 which leads to the second amplification stage.

The bias voltages for the transistor 15 are supplied from a source 31 of direct potentials, having its negative terminal coupled to ground. The voltage of source 31 may be relatively low since the collector 19 is operated at the lower voltage previously indicated. Bias for the base electrode 17 is provided by a voltage divider comprising a pair of resistances 32 and 33 connected in series in the order recited between the positive terminal of source 31 and ground. The base electrode is coupled to the common terminal of resistances 32 and 33. A resistance 34 is coupled between the emitter 18 and the positive terminal of source 31. The collector 19 is connected through inductance 27 to one terminal of an inductance 35 whose other terminal is connected to bus 36. Bus 36 may be termed the automatic gain control bus. The inductance 35 in cooperation with capacitance 29 provides decoupling at signal frequencies between the first amplification stage and the control bus and reduces fluctuation of the control voltage at audible or modulation rates at the collector. The bus 36 is connected to one terminal of a resistance 37, in which the control voltages are developed. The other terminal of resistance 37 is grounded. In connecting the collector 19 through resistance 37 to the grounded negative terminal of source 31 of relatively low potential, a collector bias level is established, in the absence of a control voltage appearing in the load resistance 37, at the relatively low collector operating voltage desired for sensitive collector voltage control. When control voltage does appear in the presence of an applied signal, the collector voltage is then further reduced in a direction to reduce the amplification of the transistor stage.

The second transistor amplifier stage may be a grounded emitter amplifier, although other types may be employed. Transistor 16 is of the "NPN" type and is provided with a base electrode 38, an emitter electrode 39, and a collector electrode 40. The coupling capacitance 30, which supplies an amplified signal from the first stage, is connected to the base 38 of transistor 16. A capacitor 41, coupled between the emitter 39 and ground, provides a low impedance path to the signal voltages from the emitter to ground. The collector electrode 40 is coupled to a parallel resonant tank circuit, serving as the collector load. The inductance 42 and capacitance 43, which form the parallel resonant tank circuit, have one common terminal connected to the collector 40. The remote terminal of capacitance 43 is grounded. The remote terminal of the inductance 42 is coupled to the positive terminal of source 44. The negative terminal of source 44 is coupled to the positive terminal of direct potential source 31. A capacitance 45 shunts source 44, and completes a low impedance path, which includes capacitance 25, between the remote terminals of inductance 42 and capacitance 43. The amplified output signal is derived at the collector connected terminal of inductance 42, to which an interstage coupling capacitance 46 is connected.

Proper bias voltages for operation of the transistor 16 are supplied by means of resistances 47, 48, and 49 and sources 31 and 44. Resistances 47 and 48 are serially connected in the order recited between the positive terminal of source 44 and ground. The base 38 of transistor 16 is coupled to the common terminal of these resistances. Emitter bias is supplied by a resistance 49 coupled between emitter 39 and ground. The collector voltage connection is through inductance 42 to the positive terminal of source 44. It may be noted that the transistor 16 is coupled to operate with a higher collector operating voltage than transistor 15 so as to obtain optimum amplification.

In some applications it may be desirable to have more than one uncontrolled amplification stage between the controlled stages and the stage in which control voltage is derived.

Transistor 50 and its associated circuitry function as the second detector in a radio receiver, and as the source of the amplification control voltage.

Transistor 50 is an "NPN" transistor, a choice which, in accordance with the invention, is complementary to the transistor employed in the controlled stage. The transistor 50 has a base electrode 51, an emitter electrode 52, and a collector electrode 53. The output of transistor 16 is applied to the base 51 through coupling capacitance 46. The emitter 52 is coupled to ground through a capacitance 54, offering a low impedance to the radio frequency signals appearing in the amplifier stages. The collector 53 is bypassed through a capacitance 55 to ground, capacitance 55 providing a low impedance path to signals of the frequencies appearing in the amplifier stages, but a high impedance to signals of modulation frequency. An audio coupling capacitance 56 is connected between the collector electrode 53 and the output terminal 57. The other output terminal 58 is connected to ground.

The transistor 50 is biased by means of resistances 59, 60, 61, and 37 energized by sources 31 and 44. Resistances 59 and 60, which are serially connected between the positive terminal of source 44 and ground, respectively, form a voltage divider for obtaining the base electrode bias. The base 51 is connected to the common junction of these resistances. Emitter 52 is coupled to ground through resistance 37, this resistance forming the impedance in which the automatic gain control is developed. The resistance 61, which is connected between the collector 53 and the positive terminal of source 44, provides the path for energization of the collector. The bias resistances are adjusted to provide rectification of an applied alternating current signal in the emitter circuit.

The embodiment of Fig. 2 may now be described in terms of performance of the functions of the intermediate frequency amplifier and second detector of a radio receiver, the gain of the intermediate frequency amplifier being controlled by a control voltage developed in the transistor serving as the second detector. Signal voltages of intermediate frequency, applied at input terminal 20, are coupled through capacitor 22 to the transistor 15 so as to establish signal currents in the base emitter circuit. These signal currents establish amplified currents in the emitter collector circuit, thereby developing a signal voltage across the parallel resonant tank circuit forming the load of the collector 19. By virtue of the selective action of the tank circuit, which is tuned to the desired intermediate frequency, signals in the desired frequency range appear at heightened power levels at the output tap 28, and are then applied through coupling capacitor 30 to the base electrode 38 of the succeeding amplifier transistor 16. Here the signals are selectively amplified to an adequately high level for operation of the succeeding detection stage. The amplified output of the second stage is developed in the tuned load inductance 42 and applied through the capacitance 46 to the base electrode 51 of the transistor 50 so as to establish currents in the base emitter circuit.

Detection is achieved by adjustment of the bias voltages of transistor 50 to the point that an alternating voltage applied between the base and emitter electrodes will pass essentially only the unidirectional alternate half waves of proper polarity in the base emitter circuit. Simultaneously, only such half waves appear in the base collector circuit. The presence of a capacitance 55, having a low impedance with respect to the intermediate frequency, serves to reduce the carrier components appearing at the collector 53 so as to deliver a continuous signal voltage to the capacitance 56 and thence to the output terminal 57.

Rectifying action takes place in the base emitter circuit and serves to produce the gain control voltage. In the base emitter circuit, essentially only portions of alternate half cycles of the applied carrier may pass. These half cycles develop a direct voltage in load resistor 37 of positive polarity having an amplitude indicative of the amplitude of the carrier. In order that the control voltage be independent of the audio frequency modulations of the carrier and in order to prevent high frequency coupling in the gain control circuit, the filter circuit comprising capacitances 54 and 29 and inductance 35 is provided.

The following circuit values have been found to provide satisfactory control voltage generation and detection action when a junction type transistor is employed:

| | |
|---|---|
| Source 31____________________________volts__ | 3 |
| Source 44____________________________do____ | 3 |
| Resistance 59________________________ohms__ | 91,000 |
| Resistance 60________________________do____ | 18,000 |
| Resistance 61________________________do____ | 5,000 |
| Resistance 37________________________do____ | 4,700 |
| Capacitance 54_________________microfarads__ | 30 |

The gain of transistor 15 is governed by the control voltage developed in the emitter load resistance 37. As previously indicated, the collector 19 of transistor 15 obtains its bias voltage from the ungrounded terminal of the resistance 37, whose other terminal is coupled to the negative terminal of low voltage source 31. An alternating signal voltage produces a current flow in the emitter circuit through resistance 37 and thereby develops a positive voltage at the ungrounded terminal of resistance 37. The magnitude of the voltage so developed increases with increasing signal strength. The appearance of the increasing positive potential in the gain control bus 36, increases the positive potential on collector 19. Since the base electrode is operated at a positive potential with respect to ground, this increase in positive potential at the collector electrode, reduces the actual collector to base potential and correspondingly reduces the amplification. When in the interests of somewhat more sensitive gain control, the collector operating bias of transistor 15 is adjusted to approximately the 1.0 volt previously specified in the absence of a control voltage, a reduction in collector voltage of 0.99 volt produces approximately 20 decibels reduction in gain.

It should be noted that in using an NPN transistor to derive a positive control voltage which increases with increasing signal strength to reduce the collector voltage of a PNP amplifier transistor, a rather simple and effective control circuit is obtained. The choice of complementary transistors, i. e. an NPN to derive the control voltage and a PNP to be subject to control voltage, establishes a sign and rate of change for the derived control voltage permitting it to be directly applied to the collector electrode of the amplifying transistor. This system of control has the important advantage that the control action is substantially independent of variations in bias supply.

Figure 3:
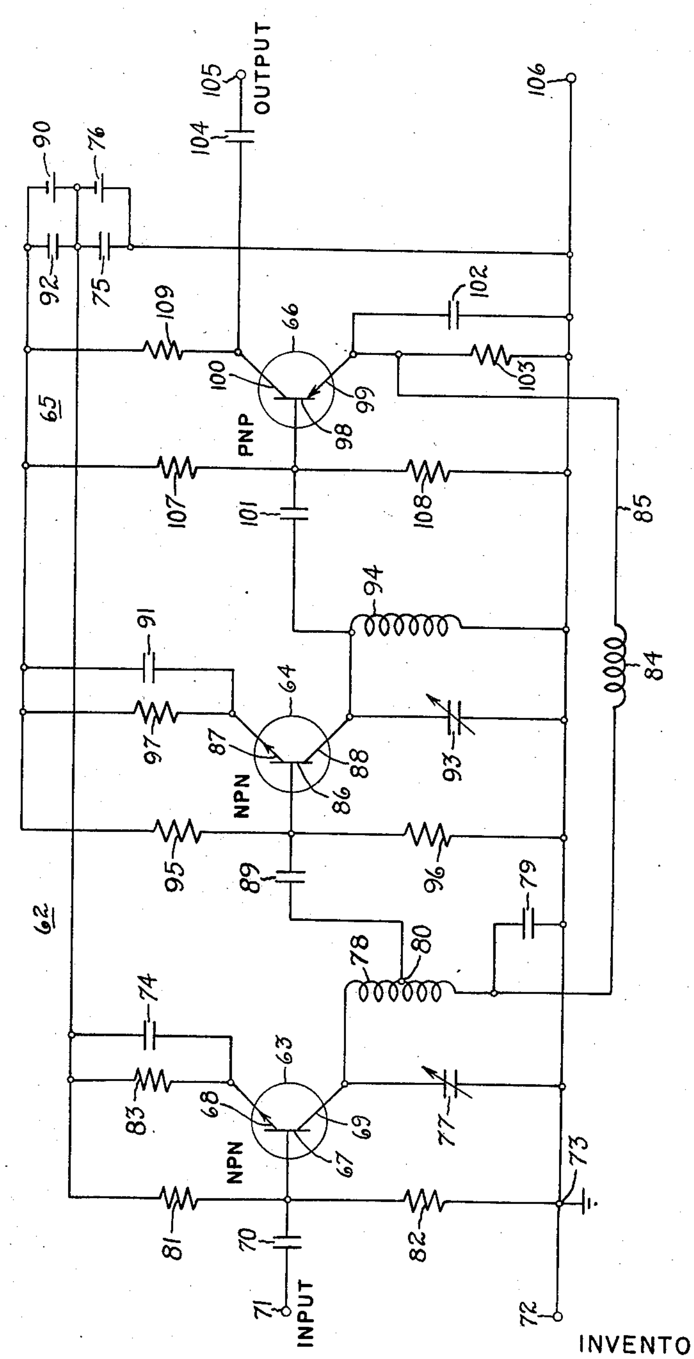
Fig. 3 is a further embodiment adapted to amplify and provide limiting of a frequency modulated signal.

As previously indicated, the invention is of general application to amplification systems, and should not be confined to the situation in which an amplifying transistor is controlled by a complementary transistor which also serves as a demodulator for an applied amplitude modulated signal. In Fig. 3 an amplifying transistor is controlled by a complementary type transistor which is a limiter of an applied frequency modulated signal, rather than a demodulator. In Fig. 3, the amplifying transistor is an NPN type while the control voltage deriving transistor is a PNP type.

At 62 is shown a two stage intermediate frequency amplifier employing two transistors 63 and 64. The intermediate frequency amplifier 62 is followed by a limiter stage 65 employing a single transistor 66.

The transistor 63 of the intermediate frequency amplifier 62 is of the NPN type and is provided with a base electrode 67, an emitter electrode 68 and a collector electrode 69, which electrodes are coupled in this embodiment in a grounded emitter configuration. The base electrode 67 is connected by means of a coupling capacitor 70 to a first input terminal 71. The other input terminal 72 is coupled to ground at 73. The emitter 68 is provided with a low impedance path to ground at signal frequencies by means of two capacitances 74 and 75 serially connected between the emitter 68 and ground, and having their common terminal connected to the negative terminal of a source 76 of direct potentials. The output potentials of transistor 63 are derived from the collector 69, which is connected to a tank circuit comprising a capacitance 77 and an inductance 78. The capacitance 77, whose other terminal is grounded, and the inductance 78 are jointly connected to the collector 69, while a capacitor 79, coupling the remote end of inductance 78 to ground, completes the tank circuit. The inductance 78 is provided with a tap 80 for connection to the succeeding transistor amplifier stage.

The bias adjustment of transistor 63 is essentially similar to that of transistor 15 of the first embodiment, although the polarity of the bias is reversed. Resistors 81 and 82 are serially connected in the order recited between the negative and positive terminals of direct current source 76. The positive terminal of direct current source 76 is grounded. The base 67 of transistor 63 is coupled to the common terminal of resistances 81 and 82. A biasing resistance 83 is provided connected between the emitter 68 and the negative terminal of source 76.

The collector supply voltage is derived through the control voltage circuit which includes inductance 84 by-passed through capacitance 79. The inductance 84 is coupled between thte terminal of resonating inductance 78 remote from collector 69 and the control voltage bus 85.

Transistor 64 may be either of the NPN or PNP type, and is shown to be of the NPN type. It has a base electrode 86, an emitter electrode 87 and a collector electrode 88. The base electrode 86 is coupled through coupling capacitor 89 to the tap 80 of the preceding stage. The emitter 87 is coupled to the negative terminal of a source 90 through resistor 97 shunted by capacitor 91. A capacitor 92, shunting source 90, and coupled between capacitor 91 and the negative terminal of source 76 completes a low impedance signal path between emitter 87 and ground. The positive terminal of source 90 is coupled to the negative terminal of source 76. The collector 88 is coupled to a parallel resonant load circuit comprising shunt connected capacitance 93 and inductance 94. The end terminals of the capacitance 93 and the inductance 94 remote from the collector 88 are grounded.

Sources 90 and 76 provide operating power for transistor 64. Operating voltage for the base electrode 86 of the transistor 64 is supplied in conventional fashion by resistances 95 and 96, serially connected between the negative terminal of source 90 and ground and having their common terminal connected to base 86. Operating voltage for the emitter electrode 87 is supplied by resistance 97 connected between emitter 87 and the negative terminal of source 90.

The limiter transistor 66, in accordance with the invention, is a PNP type transistor, of a type complementary to the controlled NPN amplifying transistor 63. Transistor 66 has a base electrode 98, an emitter electrode 99 and a collector electrode 100. The base electrode 98 is connected through a coupling capacitor 101 to the terminal of the tank inductance 94 coupled to the collector 88 of the preceding transistor 64. A capacitor 102 is coupled between the emitter 99 and ground. A resistance 103 shunts the capacitor 102 and is the impedance across which the gain control voltage is developed. The control voltage bus 85 is coupled to the emitter 99. The collector 100 is connected through capacitor 104 to the ungrounded output terminal 105. A grounded output terminal 106 provides the other output connection. Proper base bias for adjustment of the transistor 66 to act as a limiter stage is provided by resistances 107 and 108, which are serially connected between the negative terminal of source 90 and ground and having their common terminal connected to the base electrode 98. A resistance 109 connected between the collector 100 and the negative terminal of source 90 provides proper bias for collector 100 and a load impedance therefor.

Frequency modulated signals which are applied to the input terminals 71 and 72 are coupled through capacitor 70 to the base electrode of transistor 63. The transistor 63 which is coupled to act as a grounded emitter amplifier, develops an amplified signal voltage in the output inductance 78. The output voltage is derived at the tap 80 and applied through coupling capacitor 89 to the base electrode 86 of transistor 64. Transistor 64, which is also connected to act as a grounded emitter amplifier, further amplifies the signal and applies it across the load inductance 94. The output of the second transistor stage is derived from the inductance 94 and applied to the limiting amplifier transistor 66 through the capacitor 101.

The transistor 66 produces the direct control voltage. The biases of transistor 66 are adjusted to provide limiting of both negative and positive going excursions of the signal and to produce a net negative direct potential at the emitter electrode 99 for control purposes.

The negative voltage appearing at the emitter electrode 99 and in the control voltage bus 85 connected to it reduces the net collector operating voltage of collector 69 and thus the gain in the first transistor amplifier. The manner of achieving reduction in gain is generally similar to that described with respect to the embodiment of Fig. 2. Since the positive battery terminal is grounded, the base 67 of transistor 63, coupled to the voltage divider between the negative terminal of source 76 and ground, assumes a negative potential with respect to ground. Collector 69, being conductively connected to ground, is at a positive potential with respect to the base in the absence of a gain control voltage. On the occurrence of a gain control voltage which tends to make the gain control bus 85 more negative, and thus more nearly equal to voltage at the base, the effective collector operating voltage is reduced and the gain of the first transistor amplifier is reduced.

In the two embodiments described, the transistors employed to derive the control voltage serve a function in addition to the derivation of a control voltage such as the demodulation of a modulated carrier or the limiting of the amplitude of the applied signal. The invention may also be employed in circuits in which the control transistor serves only to provide the control voltage.

The invention may also be applied in arrangements wherein it is desired to control a plurality of amplifying transistors. For simplicity, the embodiments illustrated have shown merely a single controlled transistor amplifier and an intervening uncontrolled amplifier prior to the transistor in which the control voltage is derived. It should be observed that one may substitute for the single controlled amplifier stage a plurality of controlled amplifier stages if one wishes to increase the effectiveness of the control. It may also be noted that a plurality of intervening uncontrolled amplifier stages may be employed.

While particular embodiments of the invention have been shown and described, it will be obvious to those skilled in the art that various changes and modifications may be made without departing from the invention in its broader aspects and it is, therefore, intended in the appended claims to cover all such changes and modifications as fall within the true spirit and scope of the invention.

What we claim as new and desire to secure by Letters Patent of the United States:

1. In an amplification system for electric waves, the combination comprising a first semiconductor device including a base and a first collector electrode arranged to amplify applied waves, a second semiconductor device of a type complementary to said first device including an emitter and a second collector electrode, means for providing D. C. bias potentials to said devices for establishing D. C. operating points and a point of reference potential, means for applying a signal across said base and said point of reference potential, means coupling the output of said first device to said second device, means for connecting an output from said second collector to said point of reference potential, means for deriving a direct potential at said emitter having a magnitude which increases with the amplitude of applied waves, a transfer network for applying said direct potential to said first collector electrode for control of the amplification of said first device.

2. In an amplification system for radio frequency signals in which modulations are impressed upon a carrier wave the combination comprising a first semi-conductor device including a base and a first collector electrode arranged to amplify applied signals, a second semiconductor device of a type complementary to said first device including an emitter and a second collector electrode, means for providing D. C. bias potentials to said devices for establishing D. C. operating points and a point of reference potential, means for applying a signal across said base and said point of reference potential, means coupling the output of said first device to said second device, means for connecting an output from said second collector to said point of reference potential, means for deriving a direct potential at said emitter having a magnitude increasing with the carrier amplitude of applied waves, and a transfer network for applying said direct potential to said first collector electrode for control of the amplification of said first device, said transfer network having a characteristic which impedes the passage of waves of carrier frequency and a smoothing characteristic which reduces variations at modulation frequency rates in said direct potential.

3. In an amplification system for radio frequency signals in which a carrier wave is modulated in amplitude, the combination comprising a first semiconductor device including a base and a first collector electrode arranged to amplify applied signals, a second semiconductor device of a type complementary to said first device including an emitter and a second collector electrode, means for providing D. C. bias potentials to said devices for establishing D. C. operating points and a point of reference potential, said biasing means biasing said first collector electrode in the non-linear region of amplification of said first device, means for applying a signal across said base and said point of reference potential, means coupling the output of said first device to said second device, means for connecting an output from said second collector to said point of reference potential, said second device being arranged to derive a de-modulated wave in the collector circuit thereof, means for deriving a direct potential at said emitter increasing with the carrier amplitude of applied waves, and a transfer network applying said direct potential to said first collector electrode for control of the amplification of said first device, said transfer network having a characteristic which impedes the passage of waves of carrier frequency and a smoothing characteristic which reduces variations at modulation frequency rates in said direct potential.

4. In an amplification system for radio frequency signals in which a carrier is modulated in frequency, the combination comprising a first semiconductor device including a base and a first collector electrode arranged to amplify applied signals, a second semiconductor device of a type complementary to said first device including an emitter and a second collector electrode, means for providing D. C. bias potentials to said devices for establishing D. C. operating points and a point of reference potential, said biasing means biasing said first collector electrode in the nonlinear region of amplification of said first device, means coupling the output of said first device to said second device, means for applying a signal across said base and said point of reference potential, means for connecting an output from said second collector to said point of reference potential, means for deriving a direct potential increasing with the amplitude of applied waves at said emitter, and a transfer network applying said direct potential to said first collector electrode for control of the amplification of said first device, said transfer network having a characteristic which impedes the passage of waves of carrier frequency and a smoothing characteristic which reduces variations at audible rates in said direct potential.

References Cited in the file of this patent

UNITED STATES PATENTS

| | | |
|---|---|---|
| 1,849,189 | Holden | Mar. 15, 1932 |
| 1,869,331 | Ballantine | July 26, 1932 |
| 2,544,211 | Barton | Mar. 6, 1951 |
| 2,750,452 | Goodrich | June 12, 1956 |
| 2,751,446 | Bopp | June 19, 1956 |

OTHER REFERENCES

Article by Sziklai, Proc. of IRE, June 1933, pp. 717–720.

Shea Text, "Principles of Transistor Circuits," pages 396–397, pub. 1953 by John Wiley & Sons, Inc., New York.

Terman Text, "Radio Engineering," 3d ed., pages 326–327, 470–475, pub. 1947 by McGraw-Hill Book Co., Inc.